US006833695B2

United States Patent
Shen et al.

(10) Patent No.: US 6,833,695 B2
(45) Date of Patent: Dec. 21, 2004

(54) SIMULTANEOUS DISPLAY OF DATA GATHERED USING MULTIPLE DATA GATHERING MECHANISMS

(75) Inventors: Hsui-Huan Shen, Saratoga, CA (US); Stephen Dennis Jordan, Fort Collins, CO (US); Alan S. Krech, Jr., Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 47 days.

(21) Appl. No.: 10/206,319

(22) Filed: Jul. 26, 2002

(65) Prior Publication Data

US 2004/0017184 A1 Jan. 29, 2004

(51) Int. Cl.[7] ............................................. G01R 31/02
(52) U.S. Cl. ................... 324/158.1; 324/121 R
(58) Field of Search ........................ 324/158.1, 73.1, 324/121 R, 76.2; 702/66, 67, 71

(56) References Cited

U.S. PATENT DOCUMENTS 5,003,248 A * 3/1991 Johnson ................... 324/121 R
5,038,098 A * 8/1991 Birkel et al. ............. 324/121 R
5,119,018 A * 6/1992 Katayama et al. ....... 324/121 R

OTHER PUBLICATIONS

Agilent 93000 SOC Series User Training Part 1, Revision 2.2, available from Agilent Technologies, Inc. as Part No. 5968–5522E, 2000, pp. 274–278.

* cited by examiner

Primary Examiner—Vinh P. Nguyen

(57) ABSTRACT

Waveforms of input/output signals for a device under test (DUT) are simultaneously displayed. A user is presented with an interface that allows the user to specify different modes for capturing data for different input/output signals for the DUT. Data for the different input/output signals are captured in accordance with different data capture mechanisms dependent upon the different modes specified by the user. Based on the data, waveforms for each of the different input/output signals are simultaneously displayed.

19 Claims, 6 Drawing Sheets

SIMULTANEOUS DISPLAY OF DATA GATHERED USING MULTIPLE DATA GATHERING MECHANISMS

BACKGROUND

The present invention pertains to circuit testing and pertains particularly to the simultaneous display of data gathered using multiple data gathering mechanisms.

After manufacture, circuits are extensively tested to assure proper performance. For example, memory testers are used to test random access memories used in computers and other devices. Testing is typically performed by applying signals to and reading signals from pins of a device under test (DUT). Typically, the pins of a DUT function as address pins, data pins and control pins. The inputs and outputs of a DUT, including address pins, data pins and control pins are referred to herein as input/output pins or simply as pins. Some input/output pins are used just to input signals to the DUT. Other input/output pins are used just to output signals from the DUT. Other input/output pins are used both to input signals to the DUT and to output signals from the DUT.

Some test systems include programs that display waveforms for signals on the input/output pins of a DUT. Various mechanisms are used to capture signals for display.

For example, some test systems can process instructions in the test pattern and read the hardware state information to determine the waveform of signals to be placed on the inputs of the DUT. Similarly, some test systems can process instructions in the test pattern and read the hardware state information to determine the waveform of signals the test system expects to detect at the outputs of the DUT.

Some test systems make measurements at the inputs and/or outputs of a DUT in order to measure actual signals. This allows actual display of input and output signals for a DUT during a test. However, hardware constraints of test systems often limit the resolution at which data is displayed.

For example, a test system may simultaneously test multiple DUTs at one time. Simultaneous testing of up to 36 DUTs is typical. Each DUT has a multitude of input/output pins. DUTs with 64 pins or more are common. It would be time and/or cost prohibitive to use a voltage meter or oscilloscope to determine the exact voltage of every pin of every DUT being tested by a test system. For this reason, test systems typically include a compare circuit for each pin of each DUT being tested to compare the voltage at a pin with a test voltage. A voltage comparison typically can be performed at every pin once per test cycle. For increased voltage resolution of signals, several test cycles can be run and the voltage comparisons can be performed with different test voltages. For increased timing resolution of signals, several test cycles can be run and the voltage comparisons can be performed with different amounts of delay from the beginning of the test cycle.

SUMMARY OF THE INVENTION

In accordance with the preferred embodiment of the present invention, waveforms of input/output signals for a device under test (DUT) are simultaneously displayed. A user is presented with an interface that allows the user to specify different modes for capturing data for different input/output signals for the DUT. Data for the different input/output signals are captured in accordance with different data capture mechanisms dependent upon the different modes specified by the user. Based on the data, waveforms for each of the different input/output signals are simultaneously displayed.

DESCRIPTION OF THE PREFERRED EMBODIMENT

Figure 1:
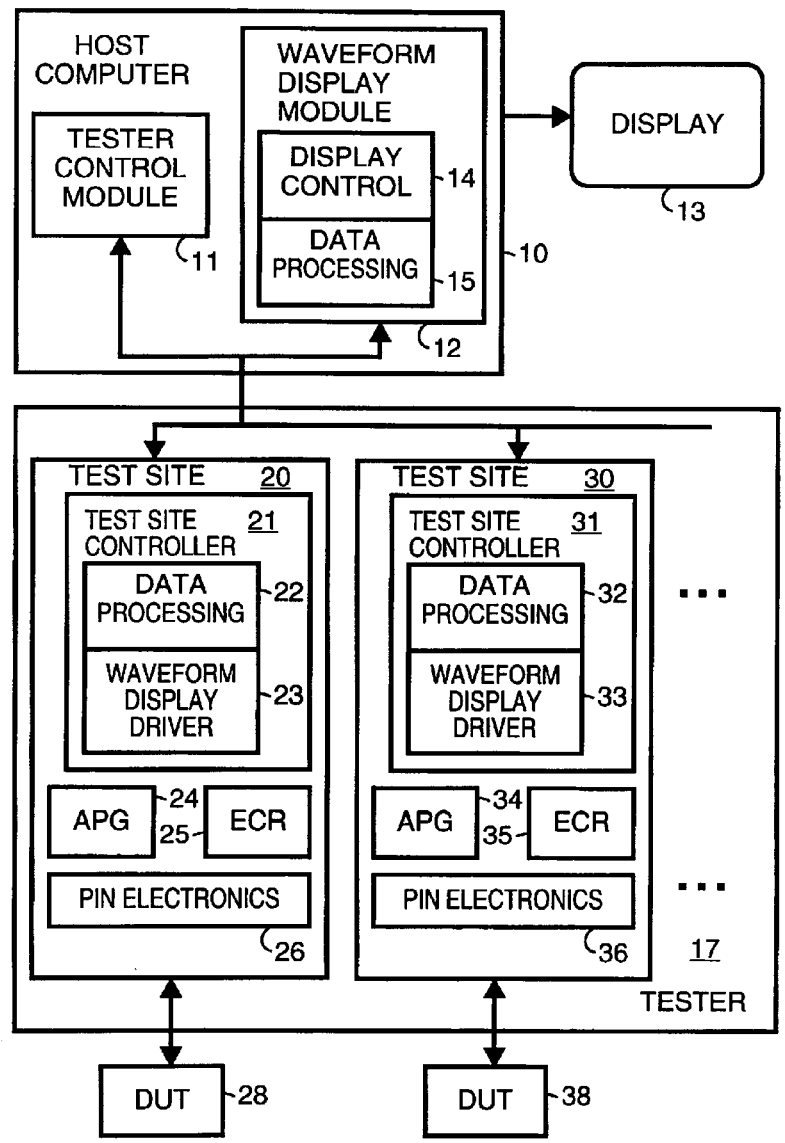
FIG. 1 is a simplified block diagram of a test system in accordance with a preferred embodiment of the present invention.

FIG. 1 is a simplified block diagram that shows a test system. A device under test (DUT) 28, and a DUT 38 represent the devices being tested. In a typical test system, 36 DUTs can be tested at one time.

Each DUT interfaces with a test site within a tester 17. For example, FIG. 1 shows DUT 28 interacting with a test site 20 and DUT 38 interacting with a test site 30.

Test site 20 includes a test site controller 21. Test site controller 21 includes a data processing block 22 and a waveform display driver 23, implemented in software. An algorithmic pattern generator (APG) 24 generates test data used to test DUT 28. Error capture RAM (ECR) includes random access memory (RAM) used to capture error information from DUT 28. Pin electronics 26 includes analog circuitry used to write signals to and read signals from DUT 28.

Depending on the data capture mechanism being used, waveform display driver 23 obtains data from monitoring pins of DUT 28 or from the test instruction memory in APG 24 and the state of test site 20 hardware. Data processing block 22 controls waveform display driver 23 instructing waveform display driver 23 what data to obtain and determining when data is valid. Data processing block 22 also arranges data in a format that waveform display module 12 expects before forwarding the data to waveform display module 12.

Test site 30 includes a test site controller 31. Test site controller 31 includes a data processing block 32 and a waveform display driver 33, implemented in software. An algorithmic pattern generator (APG) 34 generates test data used to test DUT 38. Error capture RAM (ECR) is used 35 is used to capture error information from DUT 38. Pin electronics 36 includes analog circuitry used to write signals to and read signals from DUT 38.

Depending on the data capture mechanism being used, waveform display driver 33 obtains data from monitoring pins of DUT 38 or from the test instruction memory in APG 34 and the state of test site 30 hardware. Data processing block 32 controls waveform display driver 33 instructing waveform display driver 33 what data to obtain and determining when data is valid. Data processing block 32 also arranges data in a format that waveform display module 12 expects before forwarding the data to waveform display module 12.

A host computer 10 includes a tester control module 11 and a waveform display module 12. Tester control module 11 is, for example, implemented as a software module that oversees tests performed by tester 17. Waveform display module 12 includes a data processing block 15 used to process data from tester 17 in preparation to passing the data to a display control block 14. In a preferred embodiment of the present invention, data processing block 15 and display control block 14 are implemented as software modules.

Display control block 14 is used to control display of waveform data on a display 13. The test system also includes a driver module 23 used to provide control of the test site controllers. Waveform display module 12 communicates with a test site to obtain data for display. The data can include test patterns to be placed on input/output pins of a DUT by the test site controller during testing, test results expected to be placed on the input/output pins by a DUT during testing, and/or actual signals measured on the input/output pins of a device under test. Waveform display module 12 displays waveforms on display 13.

Figure 2:
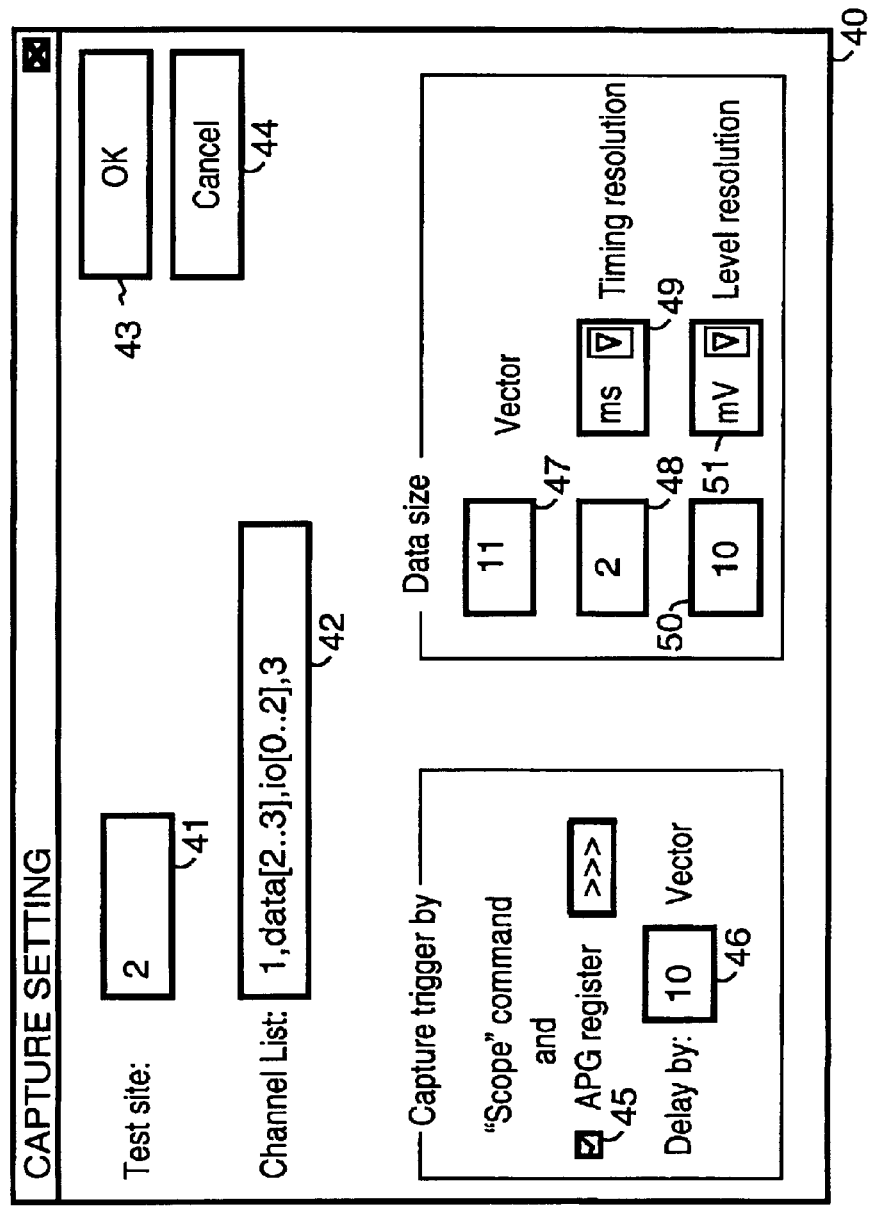
FIG. 2 shows a graphics user interface display of a window used for entering settings for capturing signals by the test system shown in Fig. 1 in accordance with a perferred embodiment of the present invention.

FIG. 2 shows a graphics user interface display of a window 40 used for entering settings for capturing signals for a DUT. Window 40 is displayed, for example, by host computer 10 on display 13. In a box 41 a user selects a test site from which to obtain the data. In a box 42, the user indicates which channels (pins or pin groups), for which waveforms will be drawn.

A box 45 can be checked when the capture trigger is conditional upon the algorithmic pattern generator (APG) state. In a box 46, a user indicates how many test vectors are ignored before data is captured. In a box 47, the user indicates for how many test vectors data signals will be captured.

In a box 48, the user can specify a value for a timing resolution. In a box 49, the user can select units for the value placed in box 48. For example, in order to increase timing resolution, the test needs to be repeated and values on input/output pins of the DUT sampled at different locations within each test cycle (i.e., each input cycle and each output cycle). Thus, the higher the timing resolution, the longer it takes to obtain test results. Adjustment of timing resolution is necessary only in scope mode and logic analyzer mode, as defined below.

In a box 50, the user can specify a value for voltage level resolution. In a box 51, the user can select units for the value placed in box 50. For example, in order to increase voltage level resolution, the test needs to be repeated and values on input/output pins of the DUT sampled against different compare voltages. Thus, the higher the voltage level resolution, the longer it takes to obtain test results. Adjustment of voltage resolution is necessary only in scope mode, as defined below.

An OK button 43 is used to confirm the capture settings indicated by the user using window 40. A cancel button 44 is used to cancel the capture settings indicated by the user using window 40.

Figure 3:
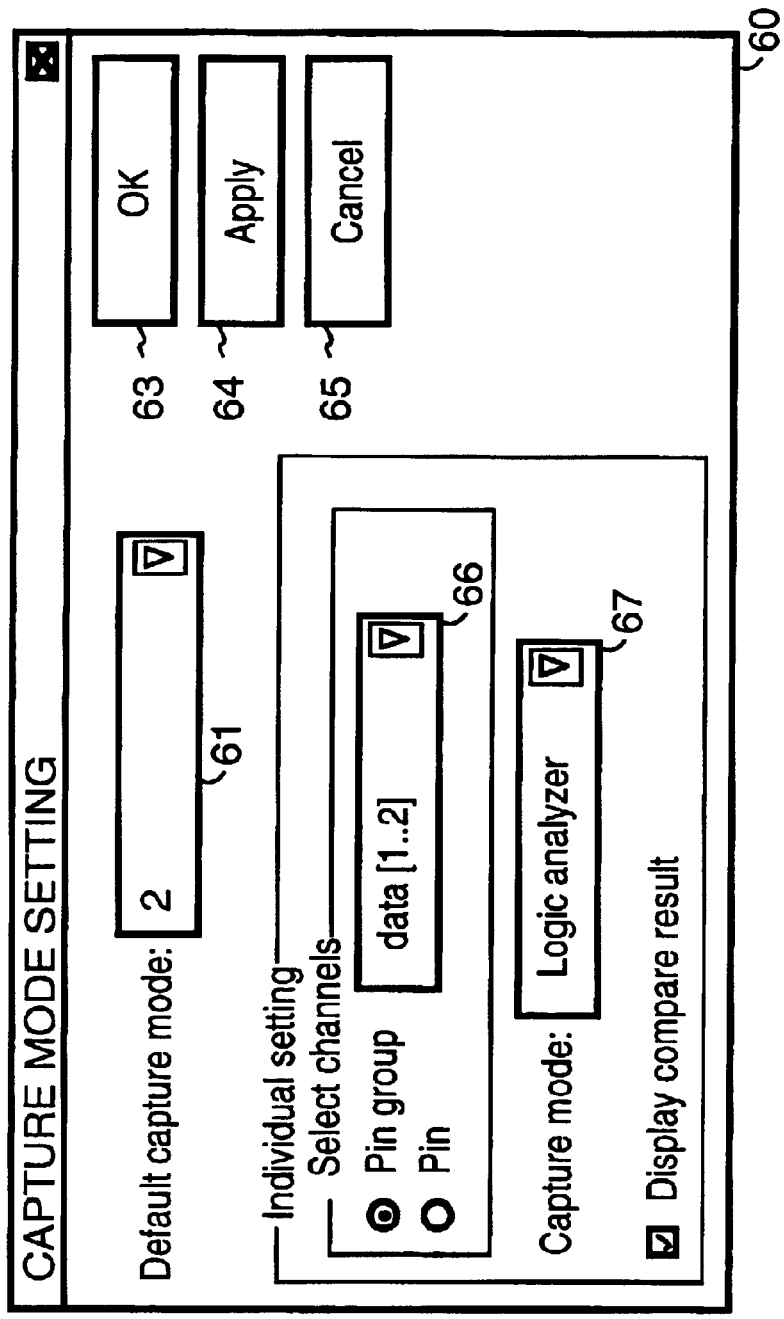
FIG. 3 shows a graphics user interface display of a window used for selecting a mode for capturing signals by the test system shown in FIG. 1 in accordance with a preferred embodiment of the present invention.

FIG. 3 shows a graphics user interface display of a window 60 used for indicating mode settings for capturing signals for a DUT. Window 60 is displayed, for example, by host computer 10 on display 13. In a box 61, a user can specify a default mode for those channels that are not specifically set by a user. In a box 67, the user selects a mode. In a box 66 the user indicates which channels (pins or pin groups), for which the settings of box 67 apply. A user can use box 66 and box 67 in window 60 multiple times to allow for different settings to be assigned to different channels of pins and pin groups.

An OK button 63 is used to confirm the capture settings indicated by the user using window 60. An apply button 64 is used to apply the capture settings indicated by the user using window 60. A cancel button 65 is used to cancel the capture settings indicated by the user using window 60.

After the user has set up a capture using window 40 and window 60, the user can start a capture by issuing a capture command. This is done, for example, by selecting a start capture button, or selecting a start capture command on a pull-down menu.

In one embodiment of the present invention there are six modes. In each mode data is captured using different data capture mechanisms, as described below.

A reconstruction mode is used to obtain input information only. In the reconstruction mode, waveform display module 12 obtains and displays voltage values. The voltage values are produced by execution of test pattern files by the waveform display driver within the selected test site. The test pattern files, generated by APG 24, are used to generate test patterns to be placed on the pins of the DUT by the test site.

An expected data mode is used to obtain output information only. In the expected data mode, waveform display module 12 obtains and displays voltage values by obtaining expected results from execution of the test pattern files. That is, the waveform display driver within the test site controller calculates what the DUT should, if operating properly, provide to output pins in response to the test patterns to be placed on the pins of the DUT by the test site.

A high speed mode is used to obtain output information only. In the high speed mode, the APG executes a test pattern file and causes the pin electronics to drive input and compare output on the pins of the DUT.

The pin electronics for each test site is run on a variable speed clock that is driven by the APG for the test site. Each cycle of the clock driven by the APG is a test cycle. For each test cycle, a new test instruction will execute. For example, if the test cycle is an input cycle, the pin electronics will drive input data on data pins and drive a write enable pin of the DUT during the input cycle. Alternatively, the pin electronics will drive input data on data pins in one input cycle and drive a write enable pin of the DUT during another input cycle. For example, if the test cycle is an output cycle, the pin electronics will drive an output enable of the DUT and the test site will compare output data received from the DUT with expected data within a single output cycle. Alternatively, the pin electronics will drive an output enable of the DUT on one output cycle and the test site will compare output data received from the DUT with expected data in another output cycle.

In high speed mode, the entire test is run once. For each output cycle, a single comparison is made for each expected output datum to determine whether the actual value on the pin of the DUT is a logic 1 (voltage output high (VOH)), a logic 0 (voltage output low (VOL)) or a high impedance (Hi-Z) as expected in the test pattern.

A logic analyzer mode is used to capture both input and output signals. In logic analyzer mode the waveforms are constructed by running the test multiple times, depending upon the timing resolution the user sets. Each time the test is run a single comparison is made for every test cycle. For each output cycle, a comparison is made to determine whether the output datum is a logic 1 (voltage output high (VOH)) or a logic 0 (voltage output low (VOL)). For each input cycle, a comparison is made on an input pin. For DUTs where the inputs are binary (either logic 1 or logic 0), a single comparison is sufficient to resolve the input. For DUTS where the input may have additional voltage levels (e.g., potential input voltage values are VHH, VIH, VIL and HIZ), it is necessary to run the test multiple times (since there is no capability to make multiple comparisons per input test cycle) in order to obtain proper resolution of input voltage values.

The number of times the test must be run depends on the timing resolution required. For example, if it is desired to have timing resolution equal to ⅕ the duration of a test cycle, it is necessary to run the test five times at different offsets from the beginning of each test cycle. This allows for binary voltage resolution of the inputs and outputs to the DUT.

Logic analyzer mode provides for "medium" speed data capture. More information is provided about the waveform transition timing, but there is minimal voltage resolution.

A scope mode is used to capture both input and output signals. The number of times each test must be run depends upon the timing resolution the user sets and the voltage resolution the user sets. Scope mode allows construction of waveforms with high timing resolution and high voltage resolution. Because of the high resolution, capture speed is slow.

For example, if it is desired to have timing resolution equal to ⅕ the duration of a test cycle and voltage resolution based on comparisons to three different voltages, it is necessary to run the test fifteen times. This allows comparisons for five different offsets at three different voltage levels for each test cycle.

An input/output (I/O) combined mode is a combination of the reconstruction mode for inputs to the DUT and the high speed mode for the outputs of the DUT. For pins used just for input to a DUT, waveform display module 12 obtains and displays voltage values by executing test pattern files. For pins used just for output from a DUT, waveform display module 12 constructs a waveform by single shot capture (as in the high speed mode). For the single shot capture, only one comparison is made on the signal for each output test cycle. Thus the time resolution and the voltage value resolution are only sufficient to determine whether a logic 0, a logic 1 or a high impedance (as expected in the test pattern) exists during a single output cycle. Since the timing resolution and the voltage value resolution are minimal, this allows for high speed capture of information. For pins used both for input and output, how a waveform is constructed is based on when data is being input to the DUT and when data is being output from the DUT. For portions of the waveform corresponding to input to the DUT, the waveform is constructed by executing test pattern files. For portions of the waveform corresponding to output from the DUT, the waveform is constructed by single shot capture.

Figure 4:
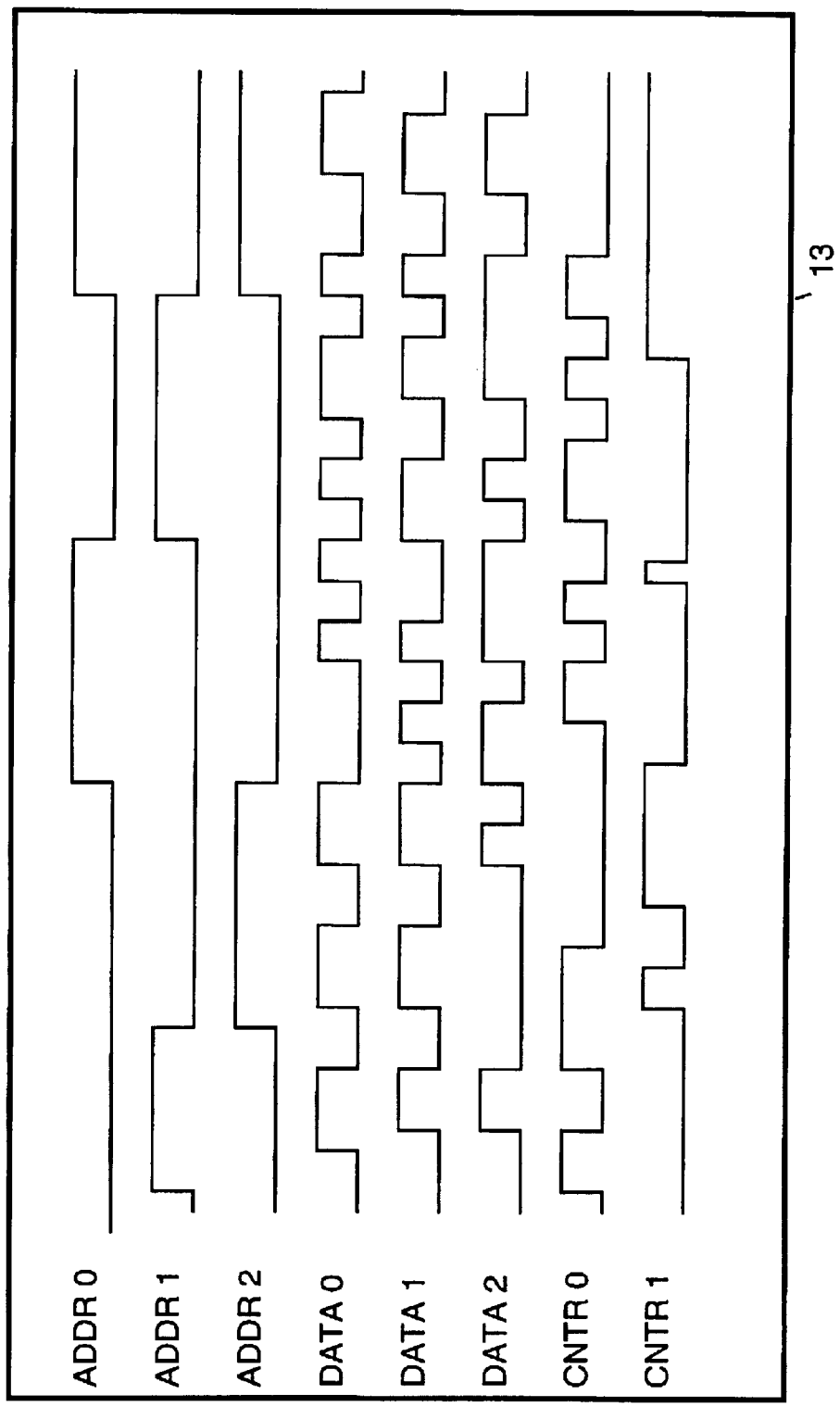
FIG. 4 shows a simplified display of waveforms captured in an input/output (I/O) combined mode in accordance with a preferred embodiment of the present invention.

In FIG. 4 a simplified example of waveforms captured in an I/O combined mode is displayed in simplified form by waveform display module 12 on display 13. The signals ADDR 0, ADDR 1 and ADDR 2 are signals from pins used just for input to a DUT. Waveform display module 12 obtains logic values by executing test pattern files and displays corresponding voltage values for these waveforms.

The signals DATA 0, DATA 1, DATA 2, CNTR 0 and CNTR 1 are signals from pins used both for input to and output from a DUT. For portions of the waveform corresponding to input to the DUT, waveform display module 12 constructs the waveform by executing test pattern files. For portions of the waveform corresponding to output from the DUT, waveform display module 12 constructs the waveform by single shot capture.

Figure 5:
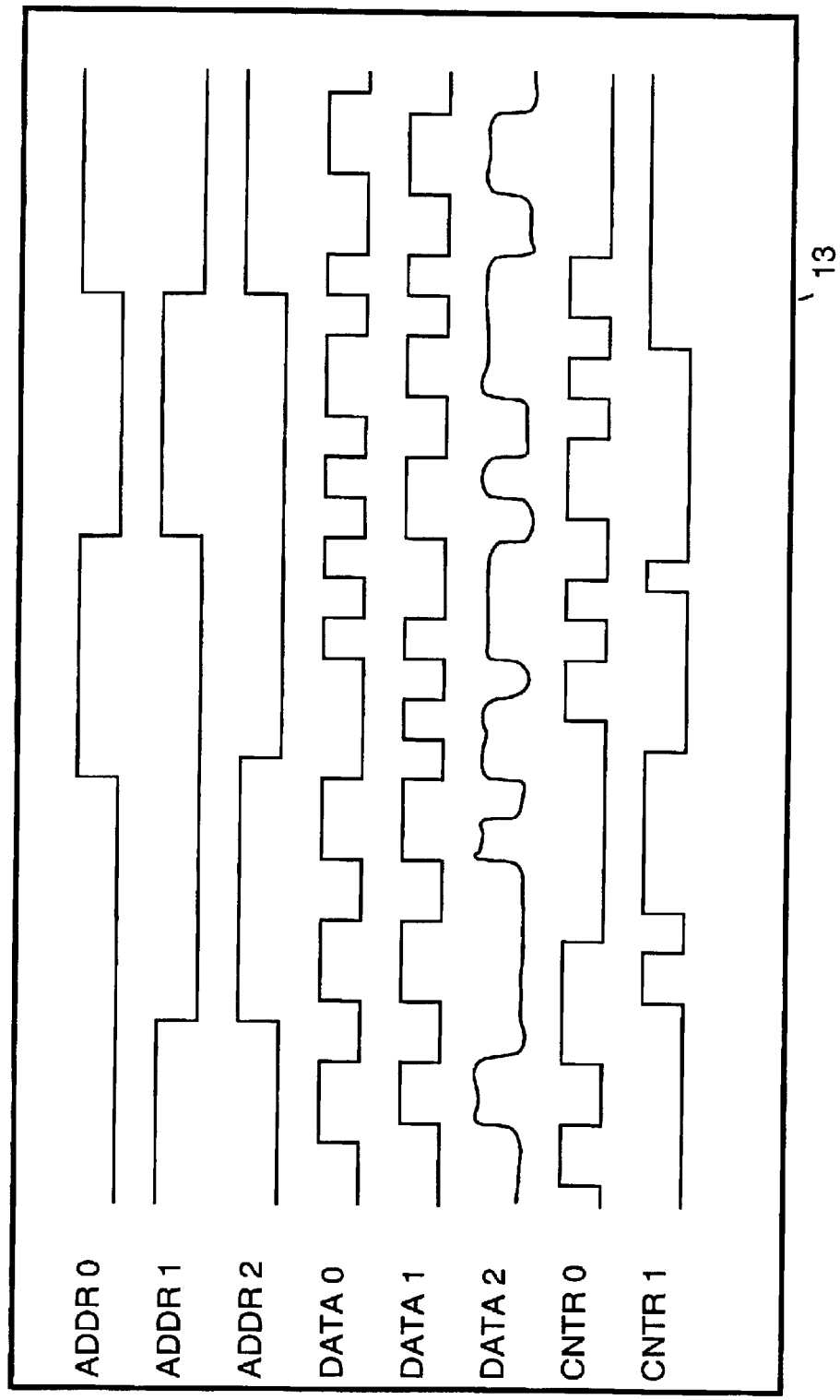
FIG. 5 shows a simplified display of waveforms captured in multiple modes in accordance with a preferred embodiment of the present invention.

FIG. 5 shows a simplified display of waveforms of the same signals, some of which are captured in different modes. Signals ADDR 0, ADDR 1, ADDR 2, DATA 0, DATA 1 and CNTR 0 are captured in I/O combined mode. CNTR 1 is captured in logic analyzer mode. DATA 2 is captured in scope mode. In logic analyzer mode the waveforms are constructed by running the test multiple times based on the timing resolution the user sets. In scope mode the waveforms are constructed by running the test multiple times based on the timing resolution set by the user and based on the voltage resolution set by the user.

Figure 6:
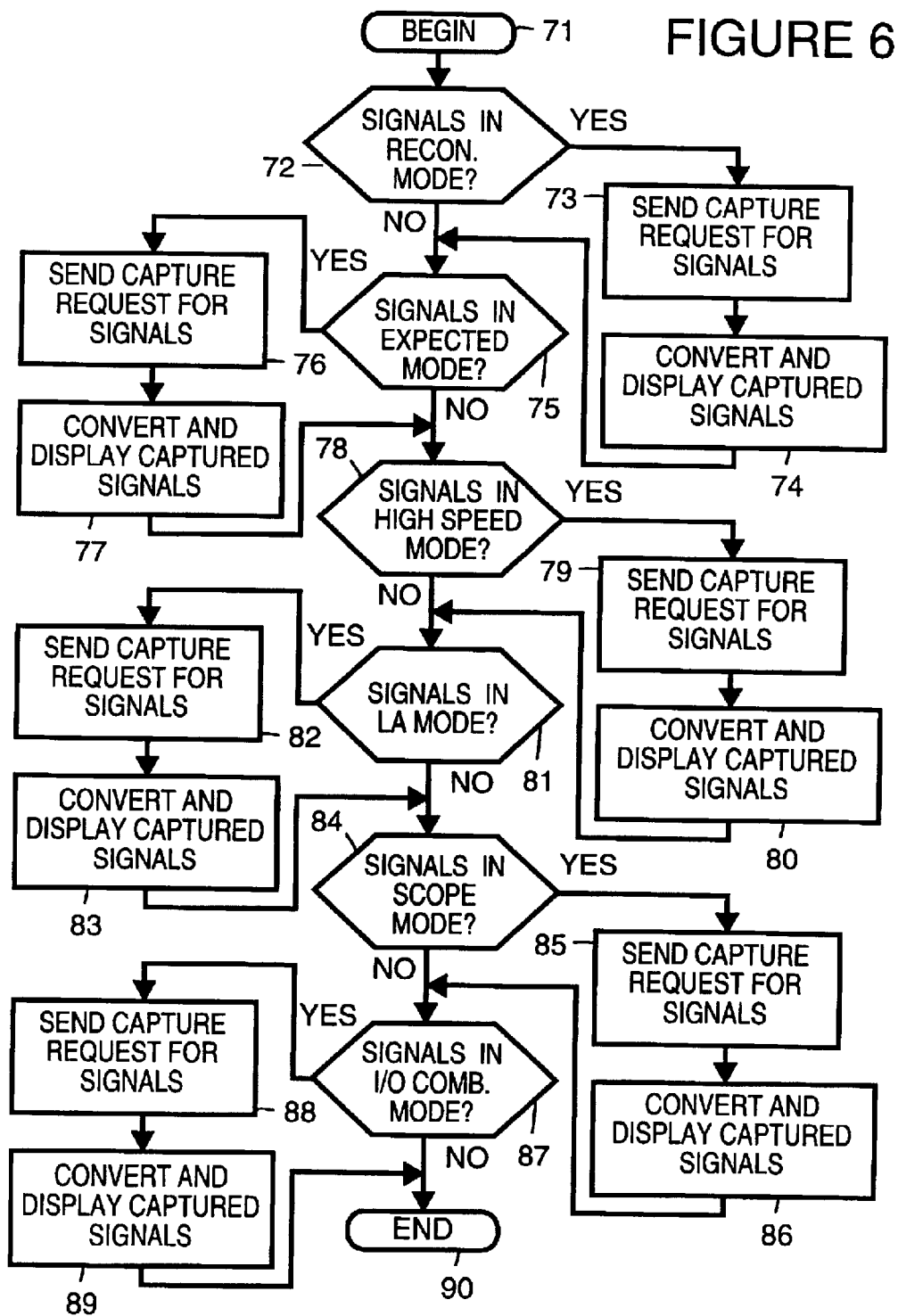
FIG. 6 is a simplified flowchart that illustrates operation of a waveform display module when displaying waveforms in accordance with a preferred embodiment of the present invention.

FIG. 6 is a simplified flowchart that illustrates operation of waveform display module 12 when a user has assigned different data gathering mechanisms to pins and/or groups of pins. The waveforms for all the pins are displayed together in a single image. This allows waveform display module 12 to respond to single setup by gathering data for all pins and progressively displaying the waveforms in the different modes selected by the user. Once waveform display module 12 completes the display process, all the waveforms requested by the user are simultaneously displayed on display 13.

In a block 71, waveform display module 12 begins a process to display waveforms requested by a user. In a block 72, waveform display module 12 checks to see if any of the signals are to be displayed in the reconstruction (RECON) mode. If so, in a block 73, waveform display module 12 sends a capture request to the selected test site for the signals to be displayed in RECON mode. Once the data on the input signals are received back, in a block 74, waveform display module 12 converts the units of the data to display coordinates and displays waveforms for the input signals on display 13. When returning data to waveform display module 12, the test site marks the output signals as unknown.

In a block 75, waveform display module 12 checks to see if any of the signals are to be displayed in the expected mode. If so, in a block 76, waveform display module 12 sends a capture request to the selected test site for the signals to be displayed in expected mode. Once the data on the output signals are received back, in a block 77, waveform display module 12 converts the units of the data to display coordinates and displays waveforms for the output signals on display 13. When returning data to waveform display module 12, the test site marks the input signals as invalid. The display is cumulative so that the waveforms are displayed in addition to the waveforms that were displayed at block 74. When displaying data, waveform display module will use insertion of waveforms as necessary in order to keep the waveforms in the order requested by user.

In a block 78, waveform display module 12 checks to see if any of the signals are to be displayed in the high speed mode. If so, in a block 79, waveform display module 12 sends a capture request to the selected test site for the output signals to be displayed in high speed mode. Once the data on the output signals are received back, in a block 80, waveform display module 12 converts the units of the data to display coordinates and displays waveforms for the output signals on display 13. When returning data to waveform display module 12, the test site marks the input signals as invalid. When displaying data, waveform display module will use insertion of waveforms as necessary in order to keep the waveforms in the order requested by user.

In a block 81, waveform display module 12 checks to see if any of the signals are to be displayed in the logic analyzer (LA) mode. If so, in a block 82, waveform display module 12 sends a capture request to the selected test site controller for the signals to be displayed in the logic analyzer mode. The capture request includes the timing resolution indicated by the user. Once the data on the signals are received back, in a block 83, waveform display module 12 converts the units of the data to display coordinates and displays waveforms for the signals on display 13. When displaying data, waveform display module will use insertion of waveforms as necessary in order to keep the waveforms in the order requested by user.

In a block 84, waveform display module 12 checks to see if any of the signals are to be displayed in the scope mode. If so, in a block 85, waveform display module 12 sends a capture request to the selected test site controller for the signals to be displayed in the scope mode. The capture request includes the timing resolution and the voltage resolution indicated by the user. Once the data on the signals are received back, in a block 86, waveform display module 12 converts the units of the data to display coordinates and displays waveforms for the signals on display 13.

In a block 87, waveform display module 12 checks to see if any of the signals are to be displayed in the I/O combined mode. If so, in a block 88, waveform display module 12 sends a capture request to the selected test site controller for the signals to be displayed in I/O combined mode. Once the data on the signals are received back, in a block 89, waveform display module 12 converts the units of the data to display coordinates and displays waveforms for the signals on display 13. In I/O mode, the data processing module of the test site controller for the selected test site indicates which part of the signals are for input and which part are for output. This allows waveform display module 12 to indicate to a user which part of the waveform represents input to the DUT and which part of the waveform represents output from the DUT.

In a block 90, waveform display module 12 has completed display of the waveforms.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for simultaneously displaying waveforms of input/output signals for a device under test (DUT), the method comprising the following steps:
   (a) presenting a user with an interface that allows the user to specify different modes for capturing data for different input/output signals for the DUT;
   (b) capturing data for the different input/output signals in accordance with a plurality of data capture mechanisms, the different modes specified by the user each specifying a different data capture mechanism from the plurality of data capture mechanisms to be used to capture data; and,
   (c) simultaneously displaying waveforms for each of the different input/output signals.

2. A method as in claim 1 wherein:
   a first data capture mechanism, from the plurality of data capture mechanisms, specified by a first mode allows a user to adjust timing resolution for capturing data for input/output signals; and,
   a second data capture mechanism, from the plurality of data capture mechanisms, specified by a second mode allows a user to adjust timing resolution for capturing data for input/output signals and to adjust voltage level resolution for capturing data for input/output signals.

3. A method as in claim 2 wherein in step (b), when a third mode is specified:
   input to the DUT is captured using a third data capture mechanism, from the plurality of different data capture mechanisms, in which voltage values are obtained by executing test pattern files; and,
   output from the DUT is captured using single shot capture of voltage level of an input/output pin on which the DUT places output.

4. A method as in claim 1 wherein in step (b) when a first mode is specified, input to the DUT is captured using a first data capture mechanism, from the plurality of different data capture mechanisms, and output from the DUT is captured using a second data capture mechanism, from the plurality of different data capture mechanisms, wherein the first data capture mechanism is different than the second data capture mechanism.

5. A method as in claim 1 wherein in step (b), when a first mode is specified:
   input to the DUT is captured using a first data capture mechanism, from the plurality of different data capture mechanisms, in which voltage values are obtained by executing test pattern files; and,
   output from the DUT is captured using single shot capture of voltage level of an input/output pin on which the DUT places output.

6. A method as in claim 1 wherein in step (b) the input/output signals include signals which are input to the DUT and signals which are output from the DUT via a same input/output pin of DUT.

7. A testing system used to test a device under test (DUT), comprising:
   a tester component that controls testing of a DUT; and,
   a waveform display module that presents a user with an interface that allows the user to specify different modes for capturing data for different input/output signals for the DUT, the waveform display module simultaneously displaying waveforms for each of the different input/output signals;
   wherein, in response to capture requests sent from the waveform display module, the tester component captures data for the different input/output signals in accordance with different data capture mechanisms dependent upon the different modes specified by the user and returns data to the waveform display module which the waveform display module uses to simultaneously display the waveforms for each of the different input/output signals.

8. A testing system as in claim 7 wherein the tester component comprises:
   a data processing module; and,
   a driver module that drives circuitry connected to the DUT.

9. A testing system as in claim 7 wherein:
   a first data capture mechanism specified by a first mode allows a user to adjust timing resolution for capturing data for input/output signals; and, a second data capture mechanism specified by a second mode allows a user to adjust timing resolution for capturing data for input/output signals and to adjust voltage level resolution for capturing data for input/output signals.

10. A testing system as in claim 9 wherein when a third mode is specified:

input to the DUT is captured using a third data capture mechanism in which voltage values are obtained by executing test pattern files; and, output from the DUT is captured using single shot capture of voltage level of an input/output pin on which the DUT places output.

11. A testing system as in claim 7 wherein when a first mode is specified, input to the DUT is captured using a first data capture mechanism and output from the DUT is captured using a second data capture mechanism, wherein the first data capture mechanism is different than the second data capture mechanism.

12. A testing system as in claim 7 wherein when a first mode is specified:

input to the DUT is captured using a first data capture mechanism in which voltage values are obtained by executing test pattern files; and, output from the DUT is captured using single shot capture of voltage level of an input/output pin on which the DUT places output.

13. A testing system as in claim 7 wherein the input/output signals include signals which are input to the DUT and signals which are output from the DUT via a same input/output pin of DUT.

14. A method for displaying waveforms for a device under test (DUT), the method comprising the following steps:

(a) presenting a user with an interface that allows the user to specify modes for capturing data for input/output signals of the DUT;

(b) capturing data for the input/output signals in accordance with different data capture mechanisms, wherein when a first mode is specified, input to the DUT is captured using a first data capture mechanism and output from the DUT is captured using a second data capture mechanism, wherein the first data capture mechanism is different than the second data capture mechanism; and, (c) displaying waveforms for the input/output signals.

15. A method as in claim 14 wherein:

when using the first data capture mechanism, voltage values are obtained by executing test pattern files; and, when using the second data capture mechanism, output from the DUT is captured using single shot capture of voltage level of an input/output pin on which the DUT places output.

16. A testing system used to test a device under test (DUT), comprising:

a tester component that controls testing of a DUT; and, a waveform display module that presents a user with an interface that allows the user to specify modes for capturing data for input/output signals for the DUT, the waveform display module displaying waveforms for the input/output signals;

wherein, in response to capture requests sent from the waveform display module, the tester component captures data for the input/output signals in accordance with data capture mechanisms dependent upon the modes specified by the user; and wherein when a first mode is specified, input to the DUT is captured using a first data capture mechanism and output from the DUT is captured using a second data capture mechanism, wherein the first data capture mechanism is different than the second data capture mechanism.

17. A testing system as in claim 16 wherein the tester component comprises:

a data processing module; and, a driver module that drives circuitry connected to the DUT.

18. A testing system as in claim 16 wherein:

when using the first data capture mechanism, voltage values are obtained by executing test pattern files; and, when using the second data capture mechanism, output from the DUT is captured using single shot capture of voltage level of an input/output pin on which the DUT places output.

19. A testing system as in claim 16 wherein the input/output signals include signals which are input to the DUT and signals which are output from the DUT via a same input/output pin of DUT.

* * * * *